United States Patent [19]

Craiglow

[11] Patent Number: 4,479,254
[45] Date of Patent: Oct. 23, 1984

[54] NOISE FLOOR AUTOMATIC GAIN CONTROL

[75] Inventor: Robert L. Craiglow, Cedar Rapids, Iowa

[73] Assignee: Rockwell International Corporation, El Segundo, Calif.

[21] Appl. No.: 453,689

[22] Filed: Dec. 27, 1982

[51] Int. Cl.³ .............................................. H04B 1/16
[52] U.S. Cl. .................................... 455/239; 455/247
[58] Field of Search ................ 455/234, 239, 242–244, 455/246, 247

[56] References Cited

U.S. PATENT DOCUMENTS

| | | | |
|---|---|---|---|
| 2,853,601 | 9/1958 | McKenna et al. | 455/247 |
| 2,921,188 | 1/1960 | Ringoen . | |
| 3,310,745 | 3/1967 | Deasy et al. | 455/246 |
| 4,204,172 | 5/1980 | Sadou et al. | 455/234 |

OTHER PUBLICATIONS

"Single Sideband Principles and Circuits" by Pappenfus, Bruene and Schoenike McGraw-Hill Book Company, New York, 1964, Section 18-3.

Primary Examiner—Marc E. Bookbinder
Attorney, Agent, or Firm—Richard K. Robinson; George A. Montanye; H. Fredrick Hamann

[57] ABSTRACT

A noise floor automatic gain control system for radio receivers that receives a modulated signal and converts the modulated signal to a demodulated signal whose amplitude is controlled by a first gain control signal. The first gain control signal is the larger of a second automatic gain control signal that is provided by automatic gain control circuit that is activated when the demodulated signal is present, or a third automatic gain control signal that is provided by a noise floor automatic gain control circuit that is activated when the demodulated signal is not present. There is a detector circuit for detecting the presence of the demodulated signal as well as a selector circuit to select either the second automatic gain control signal or the third automatic gain control signal for the first automatic gain control signal.

6 Claims, 5 Drawing Figures

NOISE FLOOR AUTOMATIC GAIN CONTROL

BACKGROUND OF THE INVENTION

This invention relates to automatic gain control circuits for single sideband receivers and, in particular, to automatic gain control circuits for single sideband receivers that have included therein a noise floor automatic gain control circuit which maintains the output background noise level at a substantial percentage below the output level of a strong signal.

There is no unique feature associated with single sideband voice communication signals to provide reliable squelch operation. The skilled operators of High Frequency (HF) radios do not normally use the prior art type squelch because of the danger of missing usable communications. If the Automatic Gain Control (AGC) is allowed to govern the audio output signal level, the noise level will be brought up to the normal speech level when the channel is idle. This high idle channel noise level is not only fatiguing to the operator, but the high acoustic noise level limits the number of receivers a single operator can monitor to two or three. The skilled HF radio operator therefore adjusts the radio frequency (RF) gain control of the radio receiver so that the AGC can no longer bring the background noise level up to the normal speech level. The output of the receiver now increases with signal level for some 20–30 dB above the noise level until the input signal level is at a high enough level to activate the AGC circuit. This procedure reduces operator fatigue and allows the operator to monitor three or four receivers simultaneously. Manual RF gain control adjustments are generally made hourly in order to maintain the background noise level at an acceptable level. However, there are no reliable, automatic, comparable AGC techniques known in the prior art that provide the volume control needed by unskilled HF operators, especially where the users have other functions to perform in addition to HF communications.

SUMMARY OF THE INVENTION

A noise floor automatic gain control system for radio receivers is disclosed that receives a modulated signal and converts the modulated signal to a demodulated signal whose amplitude is controlled by a first gain control signal. The first gain control signal is the larger of either a second automatic gain control signal that is provided by an automatic gain control circuit that is activated when the demodulated signal is present, or a third automatic gain control signal that is provided by a noise floor automatic gain control circuit that is activated when the demodulated signal is not present. There is a detector circuit for detecting the presence of the demodulated signal as well as a selector circuit for selecting either the second automatic gain control signal or the third automatic gain control signal as the first automatic gain control signal.

It is the object of this invention to provide an automatic gain control system for a radio receiver that has a first automatic gain control signal which rapidly reduces the gain of the radio receiver when a strong signal is received, and slowly increases the noise level until full audio output level is achieved in the absence of a transmitted radio signal.

It is another object of the invention to provide an automatic gain control system for a radio receiver that has a noise floor automatic gain control circuit which very slowly increases or decreases the radio receiver's gain in the absence of a receive signal, so that the output background noise level will be approximately 20 dB below the output of the strong signals.

It is yet another object of the invention to provide an automatic gain control system whose gain is controlled from the larger of two automatic gain control signals, one being developed by a traditional automatic gain control circuit and the other being developed by a noise floor automatic gain control circuit.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
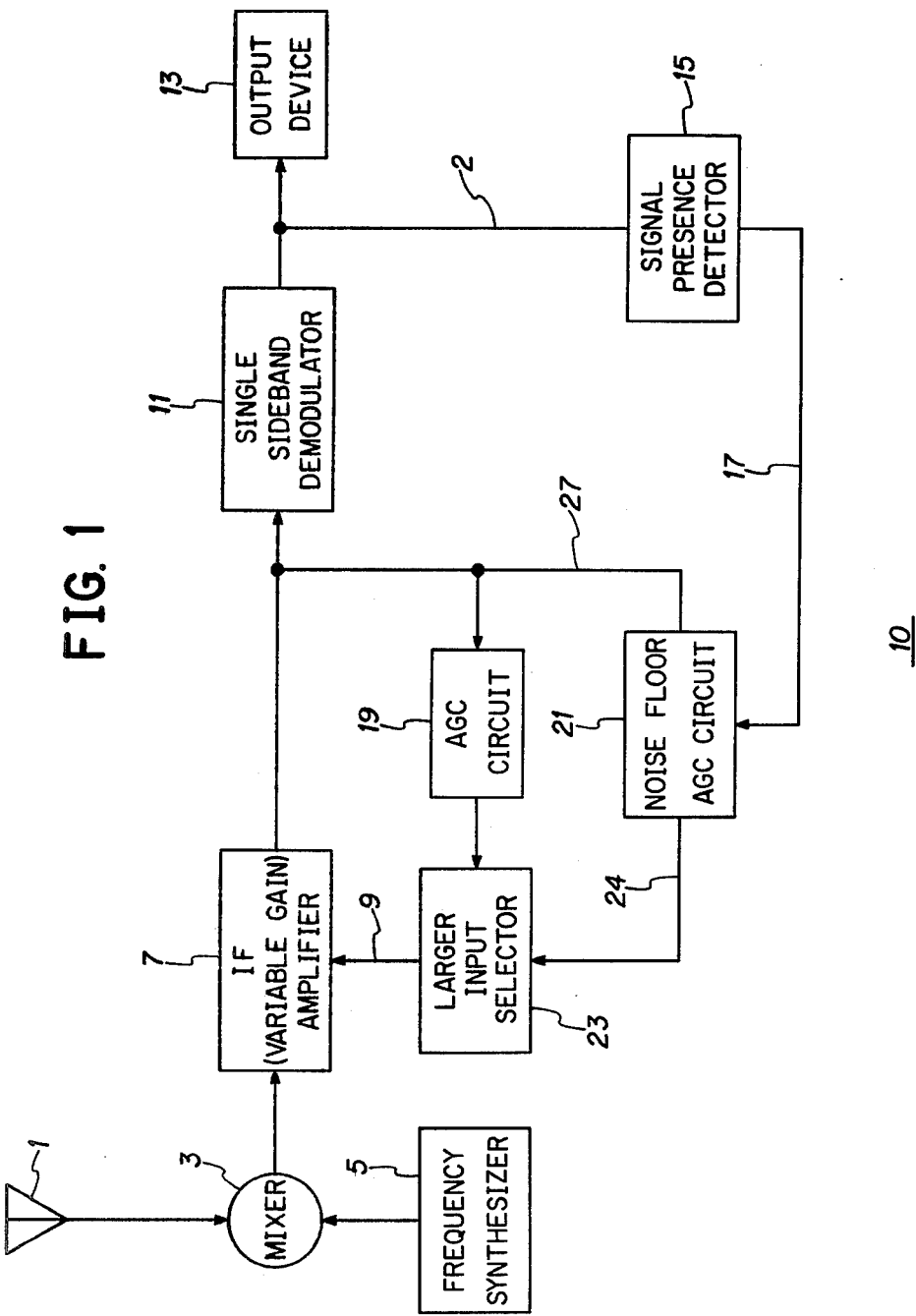
FIG. 1 is a block diagram of a radio receiver incorporating the automatic gain control system according to the invention.

In FIG. 1, to which reference should now be made, there is shown a block diagram of a radio receiver and, in particular, a single sideband HF radio receiver 10. Radio frequency signals are received by antenna 1 and applied to a mixer 3 where the received radio signal is mixed with a signal provided by a frequency synthesizer 5. The results of the mixing provide an intermediate frequency signal which is amplified by an IF amplifier 7 which is a variable gain amplifier. The gain of the IF variable gain amplifier 7 is controlled by the signal level that is present on conductor 9 and provided to it by the output signal from either an AGC circuit 19 or a noise floor AGC circuit 21. The output of the IF variable gain amplifier 7 is applied to a single sideband demodulator 11 where the IF intermediate frequency signal is demodulated to a single sideband signal, and in the preferred embodiment, an audio signal which is applied to an output device 13 such as a radio speaker.

The output of the single sideband demodulator 11 is monitored by a signal presence detector 15 which is a circuit such as a squelch circuit and detects the presence, in the preferred embodiment, of audio signals and provides the results of this detection in the form of a digital signal on conductor 17. Both the first automatic gain control circuit 19 and the noise floor automatic gain control circuit 21 try to control the gain of the IF amplifier 7. However, a larger input selector 23 which is a pair of diodes arranged as an OR circuit allows the larger of the two gain control signals to control the gain of the IF variable gain amplifier 7. The AGC circuit 19 may be any one of the several single sideband gain control circuits known in the art such as those disclosed in U.S. Pat. No. 2,921,188 or the technique discussed in Section 18-3 of the book entitled "Single Sideband Principles and Circuits" by Pappenfus, Bruene and Schoenike published by McGraw-Hill Book Company, New York, in 1964.

The noise floor AGC circuit is selected to maintain the gain of the IF variable gain amplifier 7 so that the signal that is applied to the output device 13, in the absence of a transmitted signal being picked up by the antenna 1, is approximately 20 dB below the output level of a strong transmitted signal when received by the radio receiver 10.

Figure 2:
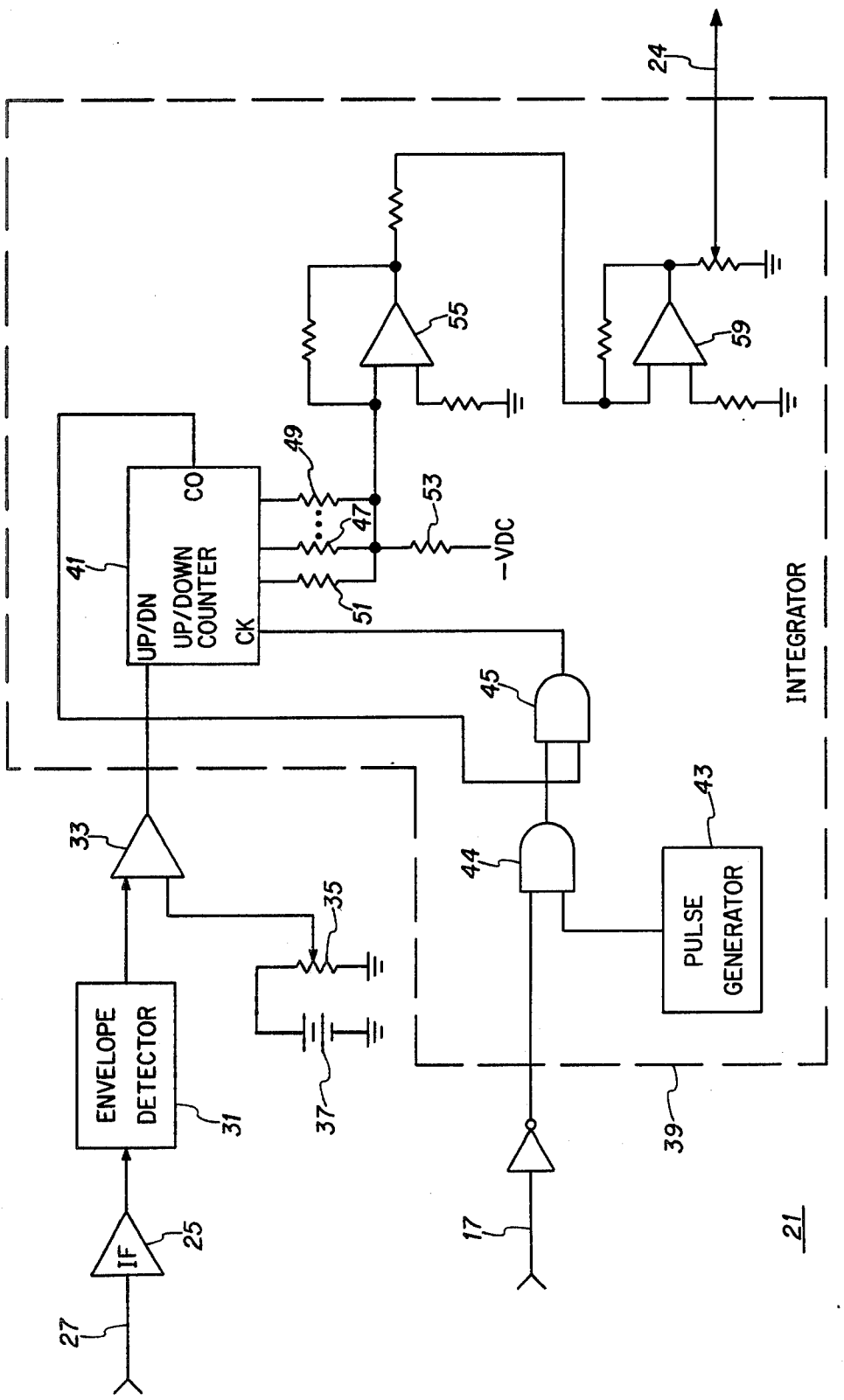
FIG. 2 is a block diagram of the noise floor AGC circuit of FIG. 1.

FIG. 2, to which reference should now be made, is a block diagram of the noise floor AGC circuit 21. The noise floor AGC circuit 21 operates on a weaker signal than does the AGC circuit 19. Consequently, an IF amplifier 25 amplifies the signal by approximately 20 dB and applies it to an envelope detector 31. The output of the envelope detector 31, the detected envelope, is applied to a comparator 33 which compares the envelope provided by the envelope detector 31 against a threshold that is provided by a potentiometer 35 and a voltage source 37. The output of the comparator 33 is either a positive or a negative signal which is applied to an integrator 39. The integrator 39 integrates at a constant positive rate whenever the output of the comparator 33 is greater than the threshold that is established by the voltage source 37 and the potentiometer 35 and at a constant negative rate whenever the envelope detector 31 is less than that established threshold. However, the detection of a signal presence as indicated by a logic 1 on conductor 17 disables the integrator 39 and holds its output voltage at its previous voltage level. The integrator 39 includes an up/down (UP/DN) counter 41 which will either count up (increase in values) or down (decrease in values) depending on the state of the output of the comparator 33 and the logic level on conductor 17. A pulse generator 43 provides a string of pulses to an AND gate 44 which in the absence of a positive signal indication provides a string of pulses to the clock input of the UP/DN counter 41 via an AND gate 45 which ANDs the carry output from the UP/DN counter 41 with the output of the AND gate 44. The output of the UP/DN counter 41 is converted to an analog signal by an A/D converter that includes a plurality of weighted summing resistors 47, 49, 51 and 53. The number of summing resistors is of course dependent upon the number of output bits from the UP/DN counter 41 and the resistances are determined by the amount of weight they are providing to the circuit. The output of the UP/DN counter 41 is summed by the adder circuit that includes the operational amplifier 55, and applied to a level shift circuit 59. The output of the level shift circuit 59 is applied to the larger input selector via conductor 24.

Since the noise floor AGC voltage that is provided on conductor 24 is held fixed as long as the audio signal is detected, the integrator 39 is implemented digitally so that there will be no drift in the noise floor AGC voltage even after it has been disabled for many minutes. A flying capacitor or sample and hold circuit would have drift associated with it. In the preferred embodiment the output from the pulse generator is set at two pulses a second and the smallest counter step corresponds to the least significant bit of the UP/DN counter 41 and is approximately equal to $\frac{1}{4}$ dB. The gain adjustment rate is therefore + or $-\frac{1}{2}$ dB per second, and it is anticipated that by adjustment of the output of the pulse generator 43 that even slower rates may be achieved and even desirable.

Figure 3:
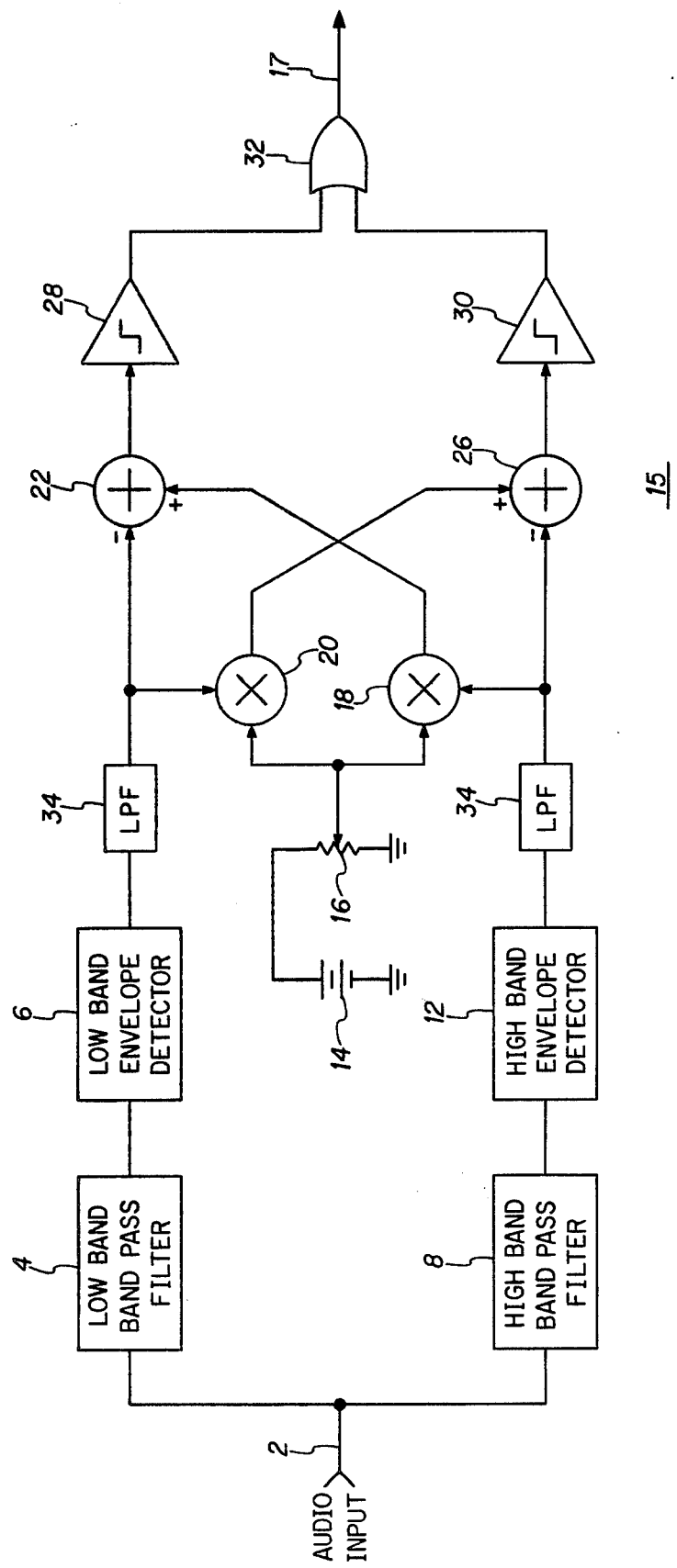
FIG. 3 is a block diagram of a signal presence detector of the automatic gain control system of FIG. 1.

FIG. 3, to which reference should now be made, is a block diagram of a signal presence detector which is similar to the prior art audio squelch circuits. The audio input is applied via conductor 2 to the signal presence detector 15 which has a low band channel and a high band channel. The low band channel includes a low band bandpass filter 4 and a low band envelope detector 6 with the bandpass filter 4 in the preferred embodiment being selected to pass frequencies within the band of 300 through 900 Hz. The high band channel includes a high band bandpass filter 8 and a high band envelope detector 12. In the preferred embodiment, the high band bandpass filter 8 is selected to pass frequencies in the band of 2100 through 2700 Hz. In both the high band and low band channels the output of the envelope detectors are applied to low-pass filters 34 which are designed to pass frequencies in the order of 2 Hz. The outputs of the low-pass filters are multiplied by multipliers 18 and 20 with a reference signal that is provided by the voltage source 14 and the potentiometer 16 and applied to summing devices 22 and 26. The output of the summing devices is applied to comparators 28 and 30. When either channel has a presence of energy as indicated by the output of the summing devices 22 and 26, the comparators 28 and 30 will have a logic 1 on either of their outputs and this logic 1 is detected by the OR gate 32. The output of or-gate 32 is applied to the conductor 17 for application to the noise floor AGC circuit 21 indicating the presence of an audio signal. The signal presence detector 15 of FIG. 3 takes the ratio of the band energies and if this ratio is appreciably higher or lower than with pure noise, a logic 1 is provided to the conductor 17. In the absence of signal energy when the noise on both the high channel and the low channels should be approximately equal and consequently there would be a logic zero on the conductor 17.

Although the present invention has been described with respect to a particular embodiment thereof, it is not to be so limited as changes might be made therein which fall within the invention as defined in the appended claims.

I claim:

1. A noise floor automatic gain control system for a radio receiver that receives a modulated signal and converts the modulated signal to a demodulated signal whose amplitude varies in response to a first automatic gain control signal controlling the gain of said radio receiver, comprising:
   automatic gain control means for providing a second automatic gain control signal for controlling the gain of the radio receiver when the demodulated signal is present;
   noise floor automatic gain control means for providing a third automatic gain control signal for controlling the gain of the radio receiver when the demodulated signal is absent; and
   selector means for selecting the larger of the second control signal or the third control signal as said first automatic gain control signal.

2. The noise floor automatic gain control system according to claim 1 wherein said noise floor automatic gain control means comprises:
   a signal presence detector for detecting the presence or absence of the demodulated signal.

3. The noise floor automatic gain control system according to claim 1 or 2 wherein the noise floor automatic gain control means comprises:
   envelope detector means for detecting the envelope of the modulated signal;
   comparator means for comparing the envelope of the modulated signal to a first selected reference; and
   integrator means for integrating the output of the comparator means to provide a constant output when the demodulated signal is present and to provide a variable output when the demodulated signal is absent.

4. A method of providing noise floor automatic gain control for a radio receiver that receives a modulated signal and converts the modulated signal to a demodulated signal whose amplitude varies in response to a first automatic gain control signal controlling the gain of said radio receiver, comprising the steps of:

providing a second automatic gain control signal for controlling the gain of the radio receiver when the demodulated signal is present;

providing a third automatic gain control signal for controlling the gain of the radio receiver when the demodulated signal is absent; and selecting the larger of the second control signal or the third control signal as said first automatic gain control signal.

5. The method according to claim 4 further comprising the step of:

detecting the presence or absence of the demodulated signal.

6. The method according to claim 4 or 5 wherein the step of providing a third automatic gain control signal comprises:

detecting the envelope of the modulated signal;

comparing the envelope of the modulated signal to a first selected reference to provide a comparison signal; and integrating the comparison signal to provide a constant output when the demodulated signal is present and to provide a variable output when the demodulated signal is absent.

* * * * *